United States Patent [19]

Purser

[11] Patent Number: 5,719,403
[45] Date of Patent: Feb. 17, 1998

[54] MEV SCANNING IONS IMPLANTER

[76] Inventor: Kenneth H. Purser, 360 N. Emerson Rd., Lexington, Mass. 02173

[21] Appl. No.: 804,249

[22] Filed: Feb. 21, 1997

Related U.S. Application Data

[63] Continuation-in-part of Ser. No. 675,567, Jul. 3, 1996.

[51] Int. Cl.⁶ .................................................. H05H 5/04
[52] U.S. Cl. ................................ 250/492.21; 250/251
[58] Field of Search ........................ 250/492.21, 492.2, 250/251, 423 R, 396 R; 315/500; 313/359.1, 361.1

[56] References Cited

U.S. PATENT DOCUMENTS

| | | | |
|---|---|---|---|
| 3,136,908 | 6/1964 | Weinman | 250/423 R |
| 5,300,891 | 4/1994 | Tokoro | 250/492.21 |

OTHER PUBLICATIONS

Nuclear Instruments and Methods in Physics Research B55 (1991) 434–438; N. Tokoro, et al.; "The beam performance of the Genus G–1500 ion implanter".

Atomic Data vol. 5, No. 2, 1973; A.B. Wittkower et al.; "Equilibrium–charge–state distributions of Energentic Ions (Z>2) in gaseous and solid media", pp. 133–136.

Nuclear Instruments and Methods 8 (1960) 195–202; Vande-Graaf; "Tandem Electrostatic Accelerators".

Reprinted from Nature, vol. 195, No.4848, pp. 1292–1293, Sep. 29, 1962; Van de Graaf, et al.; "High–Voltage acceleration tubes utilizing inclined–field principles".

Reprinted from The Review of Scientific Instruments, vol. 36, No. 4, 453–457, Apr. 1965; Purser, et al. "Properties of Inclined–Field Acceleration Tubes".

Nuclear Instruments and Methods in Physics Research B21 (1987) 334–338; John P. O'Connor et al.; "A High Current Injector For Tandem Accelerators".

Nuclear Instruments and Methods in Physics Research B21 91987) 285–295; Norman Turner, et al.; "Design Considerations of a VLSI Compatible Production MeV Ion Implantation System".

Nuclear Instruments and Methods in Physics Research B21 (1987) 264–269; H.F. Glavish, et al.; "Production High Energy Ion Implanters Using Radio Requency Acceleration".

*Primary Examiner*—Kiet T. Nguyen
*Attorney, Agent, or Firm*—Nields, Lemack & Dingman

[57] ABSTRACT

A method and apparatus for the direct current acceleration and scanning of ions of all species to energies as high as a few million electron volts (MeV). These method and apparatus have particular relevance for the controlled doping of semiconductor materials and flat panel display units. The apparatus employs high velocity neutral beams of dopant atoms to deliver atoms to the high voltage terminal where they are converted to positive ions having a low electric rigidity. This low electric rigidity makes possible a compact charge state analyzer prior to final positive ion acceleration together with compact electrostatic scanning of the ions for individual wafer implantation at MeV energies. This technology makes possible a compact implanter system.

11 Claims, 3 Drawing Sheets

MEV SCANNING IONS IMPLANTER

This application is a continuation-in-part of U.S. Ser. No. 08/675,567 filed Jul. 3, 1996 pending June 1997.

BACKGROUND OF THE INVENTION

1. Field of the Invention

This invention relates to the controlled ion implantation doping of semiconductor materials and flat panel displays by bombardment with ions having energies that, without limitations, are typically in the energy range 10 keV to 3 MeV.

2. Description of Prior Art

The doping of semiconductor materials by ion bombardment using ions is a well established industrial art. Such implantation is a critical step in the fabrication of almost all integrated circuits.

Presently there is a broadly based transformation within the semiconductor industry to move away from the use of silicon wafer substrates having a diameter of 150 mm diameter and towards the use of larger wafers having a diameter of 200 mm. This transformation, coupled with the expectation that by the year 2000 there will be even larger 300 mm wafers in widespread use, makes it desirable to implant such wafers individually rather than as part of the batch procedures that are characteristic of many present-day ion implantation machines.

To achieve single wafer implantation the incoming ions must be uniformly distributed over each individual wafer surface by some combination of mechanical or electrical scanning. The simplest such scanning procedure can be considered to be the analog of television tube rastering where the ions to be implanted are deflected by high frequency electrostatic fields to produce a uniform pattern across the wafer surface.

As the required energy of the ions increases to MeV energies, however, several technical difficulties arise in achieving such two dimensional scanning over large areas. Firstly, the magnitude of the deflection fields required and the distance between scanning plates and wafer becomes greater. Secondly, to avoid channeling along crystallographic axes or planes all ions must arrive at the wafer surface along parallel trajectories; any lack of parallelism (as small as 1° that is coherent across the wafer) may lead to reduced product yield. At the lower energies used in conventional implanters these same problems also exist but are easier to handle. To large measure they have been dealt with using the technique of 'hybrid scanning' coupled with some focusing for removing any lack of parallelness within the incoming ions.

Hybrid scanning involves deflecting the ion beam along one axis at high frequency, using triangular deflection voltages, to produce a 'curtain beam'. Moving the wafer through this curtain beam at an appropriate speed produces the required dopant concentration.

Clearly it is possible to apply these same techniques at MeV energies. However, both the deflection voltages and the lengths needed for scanning increase. Scan length increase is particularly troublesome as it causes the size of the implanter to grow; a tendency that is expensive and undesirable from the point of view of the final user.

The apparatus to be described solves both of the above problems by scanning the ions in one dimension while the energy is low, before the final acceleration stage. A second feature of such a procedure is that charge state selection for the positive ions can also be carried out at the same low energies, easing the problems of producing and maintaining high resolution deflectors.

3. Summary of the Invention

The acceleration method that is used couples dc acceleration technology with the generation, focusing and transport of a well defined beam of neutral atoms which will have an energy in a range which is of the order of 20–150 keV. My U.S. application Ser. No. 08/675,567, filed Jul. 3, 1996, discusses neutral beam technology in detail; the disclosure of said patent application is hereby incorporated herein by this reference thereto. In the present invention such a neutral beam is used to efficiently transport dopant atoms from a region at ground potential to a second region that is maintained at a selected high voltage, without kinetic energy being added or subtracted from the neutral particles. Here, the neutral particles are converted to positive ions. The ion energy remains, for example, at 150 keV, allowing the ions to be easily deflected by electric analysis and scanning fields. Charge state analysis is particularly straight forward as the electric rigidity, E/q, changes substantially from charge state to charge state. When the above positive ions leave the high voltage region, traveling back to ground through the acceleration fields between terminal potential and ground, the ions gain kinetic energy while still maintaining the transverse momentum introduced by the scanning fields. Thus, much of the deflection distance needed occurs within the accelerator itself and the geometry can be compact.

BRIEF DESCRIPTION OF THE DRAWINGS

Operation of the present invention may best be understood from the following detailed description thereof, having reference to the accompanying drawings, in which.

DESCRIPTION OF THE PREFERRED EMBODIMENT

Figure 1:
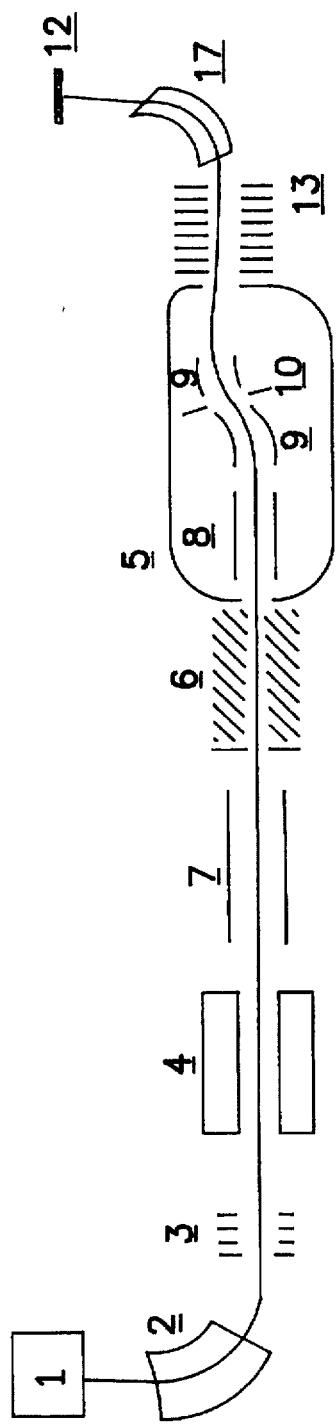
FIG. 1 shows one version of the preferred embodiment of the present invention.

The following section summarizes the operation of the preferred embodiment. Referring to the drawings and first to FIG. 1 thereof, therein is shown a schematic of the present invention.

Positive ions of the required dopant species are extracted from a suitable axially symmetrical ion source (1). Following mass analysis (2), the beam of selected ions is accelerated (3) and focused (4) to a beam waist at the center of the accelerator terminal (5) that is maintained at a positive potential up to about 1 million volts. Before entering the acceleration-field region (6) between ground potential and the terminal, the mass analyzed positive ions are focused to pass through a cell (7) containing a thin gas or vapor target where charge changing interactions cause a useful fraction of the incident ions to be converted to fast neutral atoms. These atoms continue along their original trajectories with little change in direction. As they are uncharged, the fast neutrals do not interact with the acceleration fields (6), and transit to the terminal with no change in energy or direction.

The insulated inclined field vacuum tube (6) through which the neutral beam of atoms passes sweeps secondary particles out of the high voltage region preventing breakdown at the high fluxes that the present invention will be capable of handling. The properties of such neutral beam transport tubes has been described by R. J. Van de Graaff, P. H. Rose and A. B. Wittkower, in *Nature*, Volume 1954, page 1292, (1962). Although those skilled in the art will recognize that many configurations of electric fields are possible to maximize neutral beam transmission without inducing tube breakdown, in the preferred embodiment the electric field vectors are inclined at 20-degrees to the axis of the tube, without alternation, so that not only are secondary ions rejected but in practice ions cannot be transmitted from ground potential to the high voltage terminal. This inability to transmit ions is of no disadvantage in the present apparatus as no useful purpose would be served in accelerating either positive or negative ions along this tube. This should be contrasted to the disclosure in U.S. Pat. No. 5,300,891 to Tokoro where the essence of his acceleration procedure is the capability of also transmitting positive and negative ions through the neutral beam tube.

Within the high voltage terminal these fast neutral atoms pass through a second gas or vapor cell (8), where the atoms are converted to a statistical ensemble of neutral particles and positive ions that are distributed among the positive charge states $1^+$, $2^+$, $3^+$, etc. that are populated in an established charge state distribution. The distribution functions for such interactions has been reviewed by A. B. Wittkower and H. D. Betz in *Atomic Data*, Volume 5, page 133–166, (1973). For fast boron atoms with energies of order 150 keV passing through helium gas, the equilibrium fraction is $1^+=66\%$, $2^+=23\%$. For phosphorus, the equilibrium fractions are: $1^+=40\%$, $2^+=50\%$. It is expected that both of the above $1^+$ yields will be increased somewhat by operating the stripping canal below equilibrium gas thicknesses.

Because of the requirement for energy purity of the final ion beam and because the final ion energy is proportional to the charge state, only one charge state should be accepted for acceleration in the acceleration tube 13 and transit to the wafer 12 via the magnet 17. In addition, any neutral particles that leave the stripper should be intercepted within the high voltage terminal and not be allowed to travel down the acceleration tube where charge changing in the residual vacuum can introduce background particles.

Figure 3:
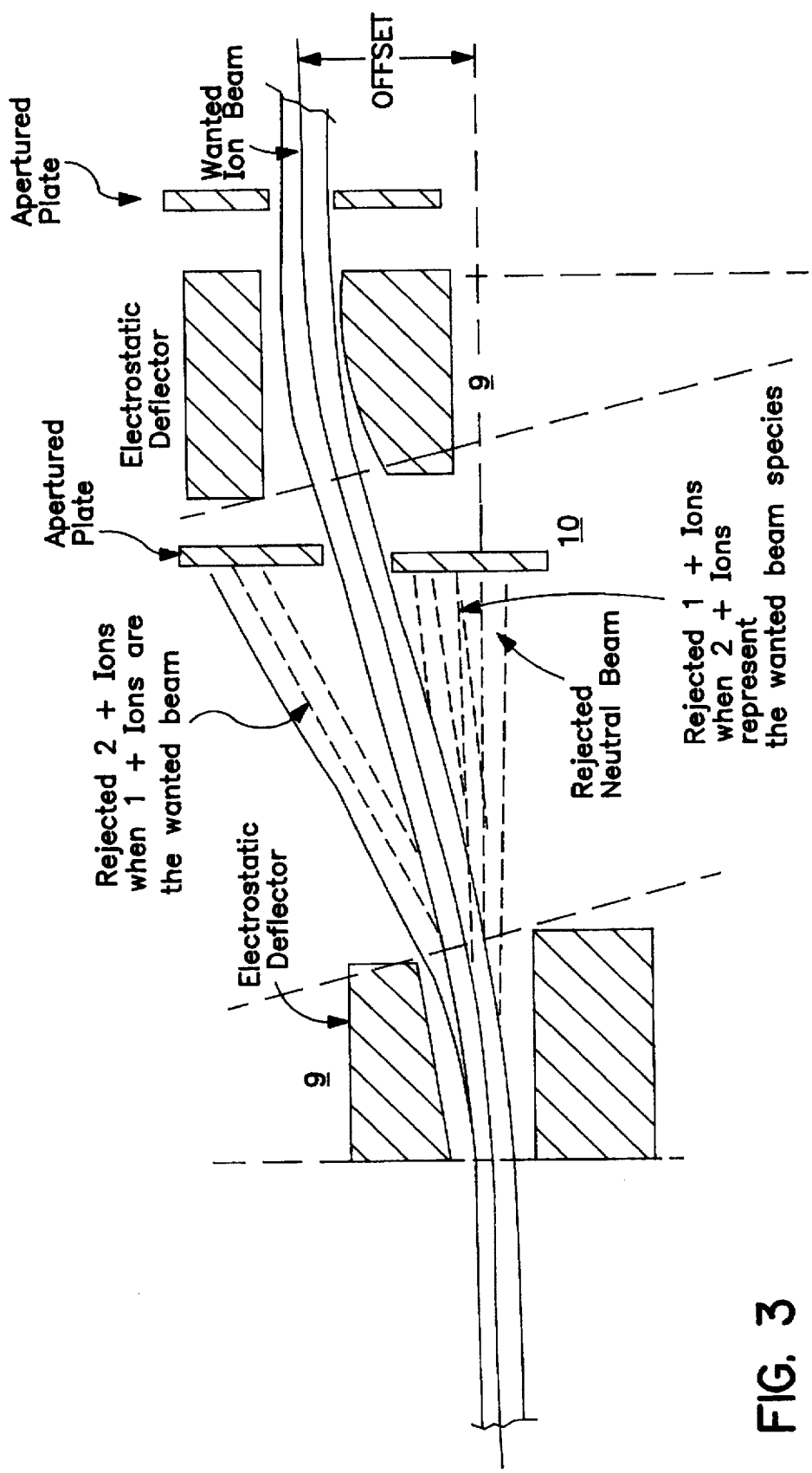
FIG. 3 shows the terminal charge-state separator.

In principle, the elimination of unwanted charge states and neutrals is straight forward. Immediately after conversion to positive polarity in the stripper all ions will have an energy of ~150 keV. Thus, the electric rigidity, energy/charge (E/q), is low and differs substantially from charge state to charge state. Following stripping, (8), the electric rigidity spectrum consists of only a few well separated peaks allowing a small electrostatic deflection, (9), to be used to eliminate at aperture, (10), ions having unwanted charge states. Those skilled in the art will recognize that there are many ways of making such charge state selections. FIG. 3 shows the preferred embodiment. A simple offset selects the wanted charge state and eliminates all other charge states and neutrals. The voltages on all elements are identical allowing the elements to be driven by a single power supply that is controllable from ground to permit charge state selection and thus final energy selection. Those skilled in the art will recognize that a second symmetrical set of deflectors (not shown) can be added to bring the positive ion beam back onto the neutral beam axis.

Figure 2:
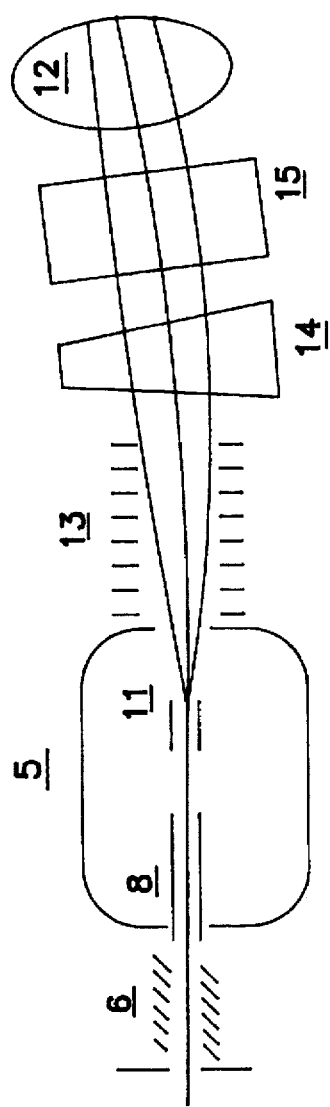
FIG. 2 shows a second version of the preferred embodiment of the present invention showing the overall hybrid scanning apparatus.
Figure 4:
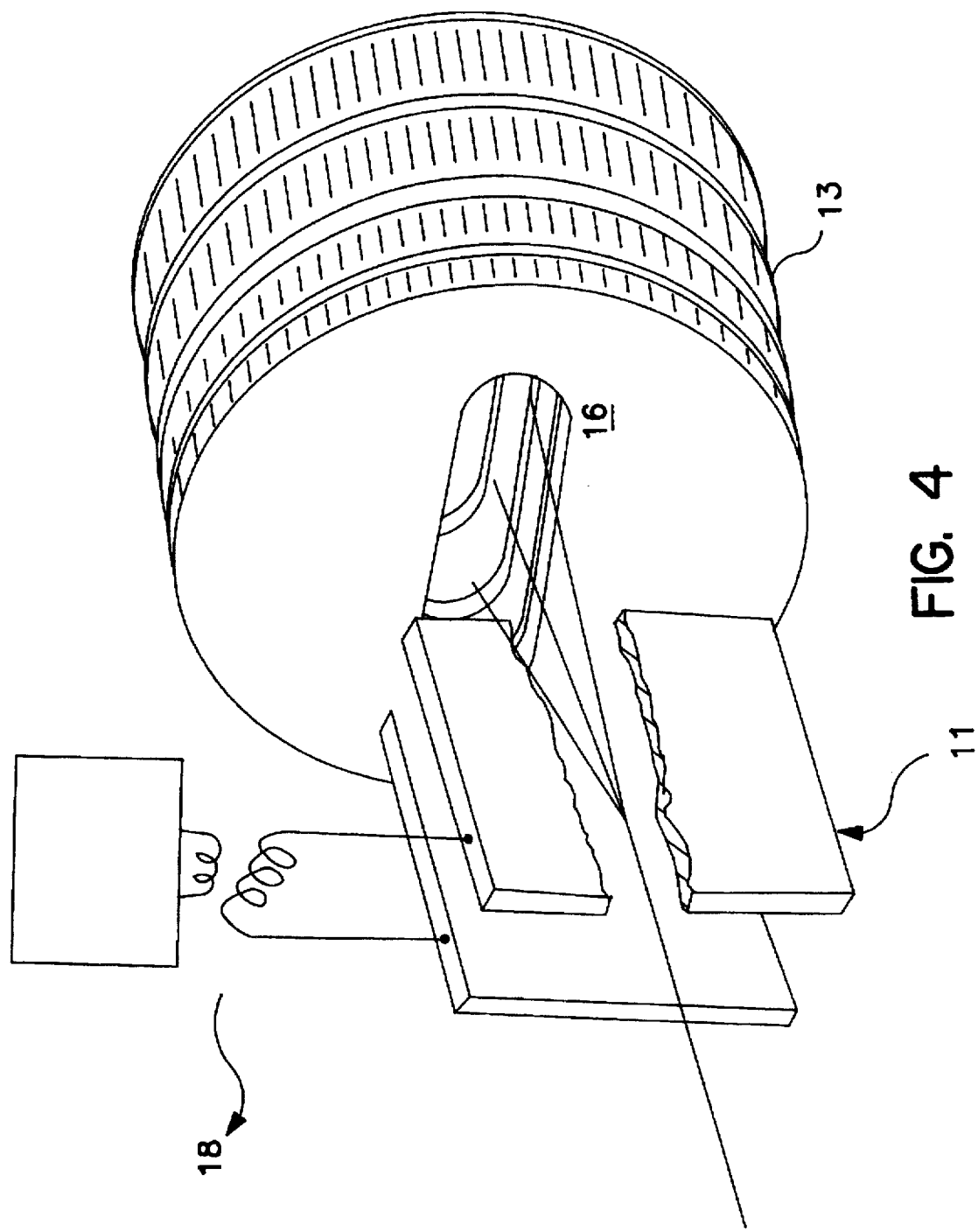
FIG. 4 shows the terminal scanner

For those occasions where single wafer processing is desirable, scanning is essential to satisfy the hybrid rastering requirement discussed earlier. Using the same reasoning, that the electric rigidity of the ions is low within the high voltage terminal, a compact deflector (11) such as a d.c. magnetic field deflector can be included as shown in FIG. 2 to provide the rastering deflections that are needed for hybrid scanning. FIG. 4 shows how this electrostatic deflection can be compactly achieved within the high voltage terminal of the accelerator. An electrostatic deflector 11 supplied by a member 18 with a computer generated voltage wave form, having substantially a triangular shape, an oscillating electrostatic field, deflects the ions to produce a uniform ribbon beam at ground. The attractiveness of this procedure is that the distance between the terminal and wafer is substantial. Thus, only small angles need be introduced to the ion beam to scan across a 200 mm wafer (12).

After leaving the high voltage terminal the positive ions are accelerated to ground in the acceleration tube 13 by repulsion from the positive terminal where they arrive with a final energy given by:

$$E_f = E_n + q \cdot e \cdot V_t \quad (1)$$

Here, $E_f$ is the final ion energy $E_n$ is the kinetic energy of the neutral beam atoms q is the charge state of the positive ions leaving the terminal $V_t$ is the terminal voltage e is the electronic charge Using a maximum terminal voltage of 1200 kV and a neutral beam energy of 150 keV, it can be seen that for ions having a charge state of q=1+, the maximum final energy is 1.35 MeV. For q=2+ the final energy is 2.55 MeV. It is believed that for semiconductor doping more than 75% of the MeV implant requirements will be satisfied by a device having such energy specifications.

It can be seen from FIG. 4 that the ions are deflected along the slotted entrance (16) to the acceleration tube (13). In this manner the natural focusing properties at the entrance to the acceleration tube are concentrated in the direction at right angles to the scanning motion and do not affect the transverse momentum introduced to the ions by the scanning voltages. Within this acceleration tube the ions are returned to ground potential where they arrive with an energy given by equation 1 and with an angular spread of a few degrees from the scanning. This angular deviation changes linearly from end to end of the sweep and so can be reduced to almost zero by using the optical effects of a small angle deflection through a suitable magnetic field wedge.

As shown in FIG. 2, upon leaving the accelerator section the ions are deflected magnetically by a wedge shaped magnet (14) the construction of which is well understood by those skilled in the art. This deflection corrects for the non-parallelness introduced by the scanning deflection. In the preferred embodiment shown in FIG. 2 the final element in the single wafer beam transport system is a few degree electrostatic deflection (15). The deflector (15) introduces charge particle deflection in the plane at right angles to the preceding magnetic deflection (14). A suitable baffle eliminates neutral components that have been introduced by charge changing within the residual gas. A wafer holder (12) transports the wafer across the scanned ribbon beam.

Having thus described the principles of the invention, together with several illustrative embodiments thereof, it is to be understood that, although specific terms are employed, they are used in a generic and descriptive sense, and not for purposes of limitation, the scope of the invention being set forth in the following claims.

I claim:

1. A method of implanting wanted ions having specified energy to surfaces of semiconductors, which comprises the following steps:

maintaining a terminal region at an elevated positive electrical potential;

transmitting neutral atoms to said terminal region;

removing electrons from said neutral atoms to form a positive ion beam within said terminal region;

accelerating at least a portion of said positive ion beam to ground potential;

analyzing said positive ion beam and rejecting positive ions in said positive ion beam not having a specified charge state within said terminal region; and directing positive ions in said positive ion beam that have not been rejected onto said surfaces.

2. The method in accordance with claim 1, further including the step of scanning said portion of said positive ion beam in a time varying manner within said terminal region to modify the direction of travel of the positive ions in said portion of said positive ion beam as they are accelerated from said terminal region to ground potential.

3. A method of implanting wanted ions having specified energy to surfaces of semiconductors, which comprises the following steps:

maintaining a terminal region at an elevated positive electrical potential;

transmitting neutral atoms to said terminal region;

removing electrons from said neutral atoms to form a positive ion beam within said terminal region;

accelerating at least a portion of said positive ion beam to ground potential;

scanning said portion of said positive ion beam in a time varying manner within said terminal region to modify the direction of travel of the positive ions in said portion of said positive ion beam as they are accelerated from said terminal region to ground potential; rejecting positive ions in said positive ion beam not having a specified charge state; and directing positive ions in said positive ion beam that have not been rejected onto said surfaces.

4. Apparatus for the implantation of wanted atoms having specified energy to surfaces of semiconductors, which comprises the following components in combination:

a source of positive ions derived by charge changing from a neutral beam of atoms, said source being located within a terminal region maintained at an elevated positive electrical potential;

a high-voltage acceleration tube, having an acceleration tube axis, for accelerating at least a portion of said positive ions to ground potential along said acceleration tube axis;

means for analyzing said positive ions of said source and rejecting positive ions not having a specified charge state from said source within said terminal region so that substantially all of the positive ions that enter said high voltage acceleration tube have a specified charge state; and means for directing said accelerated positive ions leaving said high-voltage acceleration tube onto the surface of the semiconductor.

5. Apparatus in accordance with claim 4, wherein said means for analyzing said positive ions includes the following components:

an apertured member; and an analyzer for deflecting said positive ions so that only positive ions having a specified charge state pass through said apertured member.

6. Apparatus in accordance with claim 5, wherein said means for analyzing said positive ions comprises a d.c. magnetic field deflector.

7. Apparatus in accordance with claim 5, wherein said means for analyzing said positive ions comprises an electrostatic field deflector.

8. Apparatus for the implantation of wanted atoms having specified energy to surfaces of semiconductors, which comprises the following components in combination:

a source of positive ions derived by charge changing from a neutral beam of atoms, said source being located within a terminal region maintained at an elevated positive electrical potential;

a high-voltage acceleration tube, having an acceleration tube axis, for accelerating at least a portion of said positive ions to ground potential along said acceleration tube axis;

means for scanning in angle the direction of travel of at least some of said positive ions from said source within said terminal region; and means for directing said accelerated positive ions leaving said high-voltage acceleration tube onto the surface of the semiconductor.

9. Apparatus in accordance with claim 8, further including means for rejecting positive ions in said source of said positive ions not having a specified charge state and means for analyzing said positive ions from said source within said terminal region so that substantially all of the positive ions that enter said high voltage acceleration tube have a specified charge state.

10. Apparatus in accordance with claim 9, wherein said means for scanning performs electrostatic scanning.

11. Apparatus in accordance with claim 9, wherein said means for scanning includes an oscillating electrostatic field.

* * * * *